(12) United States Patent
Sato

(10) Patent No.: US 9,865,661 B2
(45) Date of Patent: Jan. 9, 2018

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/954,429

(22) Filed: Nov. 30, 2015

(65) Prior Publication Data

US 2016/0155782 A1    Jun. 2, 2016

(30) Foreign Application Priority Data

Dec. 1, 2014 (JP) .................................. 2014-243471

(51) Int. Cl.
| | | |
|---|---|---|
| *H01L 27/32* | (2006.01) | |
| *H01L 31/075* | (2012.01) | |
| *H01L 31/105* | (2006.01) | |
| *H01L 51/52* | (2006.01) | |
| *H01L 27/146* | (2006.01) | |
| *H01L 51/42* | (2006.01) | |

(52) U.S. Cl.
CPC ...... *H01L 27/3227* (2013.01); *H01L 27/3246* (2013.01); *H01L 31/075* (2013.01); *H01L 31/105* (2013.01); *H01L 27/14627* (2013.01); *H01L 27/322* (2013.01); *H01L 27/3276* (2013.01); *H01L 51/4293* (2013.01); *H01L 51/5275* (2013.01); *Y02E 10/52* (2013.01)

(58) Field of Classification Search
CPC ..................... H01L 27/3227; H01L 27/3246
See application file for complete search history.

(56) References Cited

U.S. PATENT DOCUMENTS

| | | | | |
|---|---|---|---|---|
| 2010/0134735 | A1* | 6/2010 | Nakamura | .......... H01L 31/1055 349/116 |
| 2013/0140573 | A1* | 6/2013 | Nakamura | ........ H01L 21/02532 257/59 |

FOREIGN PATENT DOCUMENTS

JP         2012-037703 A      2/2012

* cited by examiner

*Primary Examiner* — Matthew Reames
(74) *Attorney, Agent, or Firm* — Typha IP LLC

(57) ABSTRACT

A display device includes a pixel electrode provided on an insulating surface, a pixel separation film provided on an end of the pixel electrode, a light-emitting layer provided to cover the pixel electrode, and a counter electrode provided to cover the light-emitting layer and the pixel separation film. The pixel separation film includes a photoelectric conversion element, one of a first electrode and a second electrode of the photoelectric conversion element is electrically connected to the counter electrode, and the other is electrically connected to a wiring through which current generated by the photoelectric conversion element flows.

12 Claims, 12 Drawing Sheets

DISPLAY DEVICE

CROSS-REFERENCE TO RELATED APPLICATION

The present application claims priority from Japanese application JP2014-243471 filed on Dec. 1, 2014, the content of which is hereby incorporated by reference into this application.

BACKGROUND OF THE INVENTION

1. Field of the Invention

The present invention relates to a display device.

2. Description of the Related Art

In a display device such as an organic EL (Electro Luminescence) display device, there is a case where an image is displayed by controlling a pixel including a self light-emitting element such as an organic light-emitting diode. The display device including the self light-emitting element, such as the organic EL display device, is superior in visibility and response speed as compared with a related art liquid crystal display device, and further thinning is possible since an auxiliary illuminating device such as a backlight is not required.

JP 2012-37703 A discloses a display device in which a solar cell and an organic light-emitting element are on the same surface, and power generated by the solar cell is used to drive the organic light-emitting element.

SUMMARY OF THE INVENTION

In the organic EL display device or the like, part of light emitted from the self light-emitting element is emitted in an adjacent pixel direction. As a result, light leakage to the adjacent pixel can occur. Besides, there exists no little light that is not emitted to the outside from the self light-emitting element but is absorbed by a surrounding member, and waste of power consumption can occur.

An object of the invention is to provide a display device which can prevent light leakage to an adjacent pixel. Besides, another object thereof is to provide a display device which can reduce power consumption.

According to the invention, a display device includes a pixel electrode provided on an insulating surface, a pixel separation film provided on an end of the pixel electrode, a light-emitting layer provided to cover the pixel electrode, and a counter electrode provided to cover the light-emitting layer and the pixel separation film. The pixel separation film includes a photoelectric conversion element, one of a first electrode and a second electrode of the photoelectric conversion element is electrically connected to the counter electrode, and the other is electrically connected to a wiring through which current generated by the photoelectric conversion element flows.

DETAILED DESCRIPTION OF THE INVENTION

Figure 1:
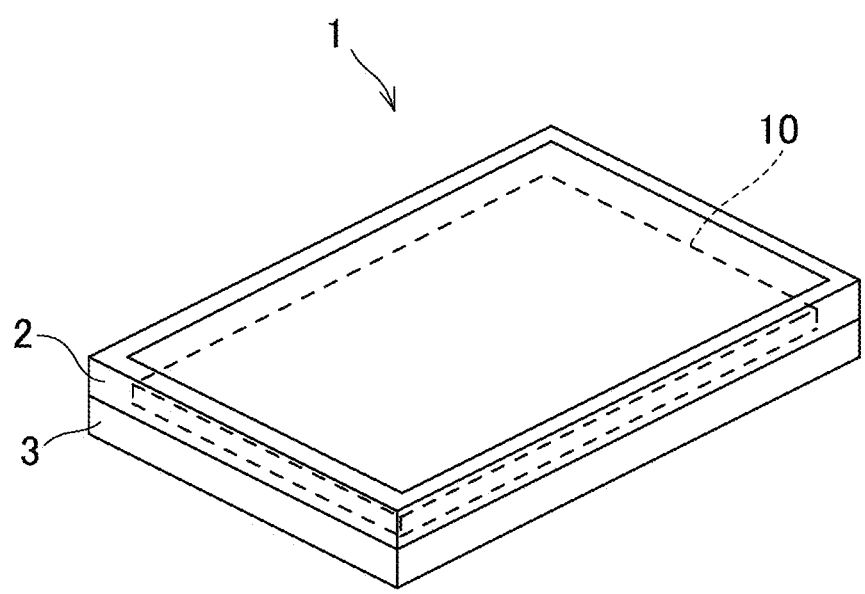
FIG. 1 is a perspective view of an organic EL display device of an embodiment of the invention.

Hereinafter, embodiments of the invention will be described with reference to the drawings. Incidentally, the disclosure is merely an example, and suitable modifications not departing from the spirit of the invention and easily conceivable by a person skilled in the art naturally fall within the scope of the invention. Besides, although widths, thicknesses, shapes and the like of respective parts may be schematically shown in the drawings in order to more clarify the description, they are merely an example and do not restrict the interpretation of the invention. Besides, in the specification and the respective drawings, the same components as those described in the drawings already shown are denoted by the same reference numerals and the detailed description thereof is suitably omitted.

FIG. 1 is a perspective view showing an organic EL display device 1 of an embodiment of the invention. The organic EL display device 1 includes an organic EL panel 10 fixed to be sandwiched between an upper frame 2 and a lower frame 3. Although not particularly shown, an external drive circuit for driving the organic EL panel 10, together with organic EL panel 10, may be provided in the inside between the upper frame 2 and the lower frame 3, or may be provided outside through a lead-out wiring.

Figure 2:
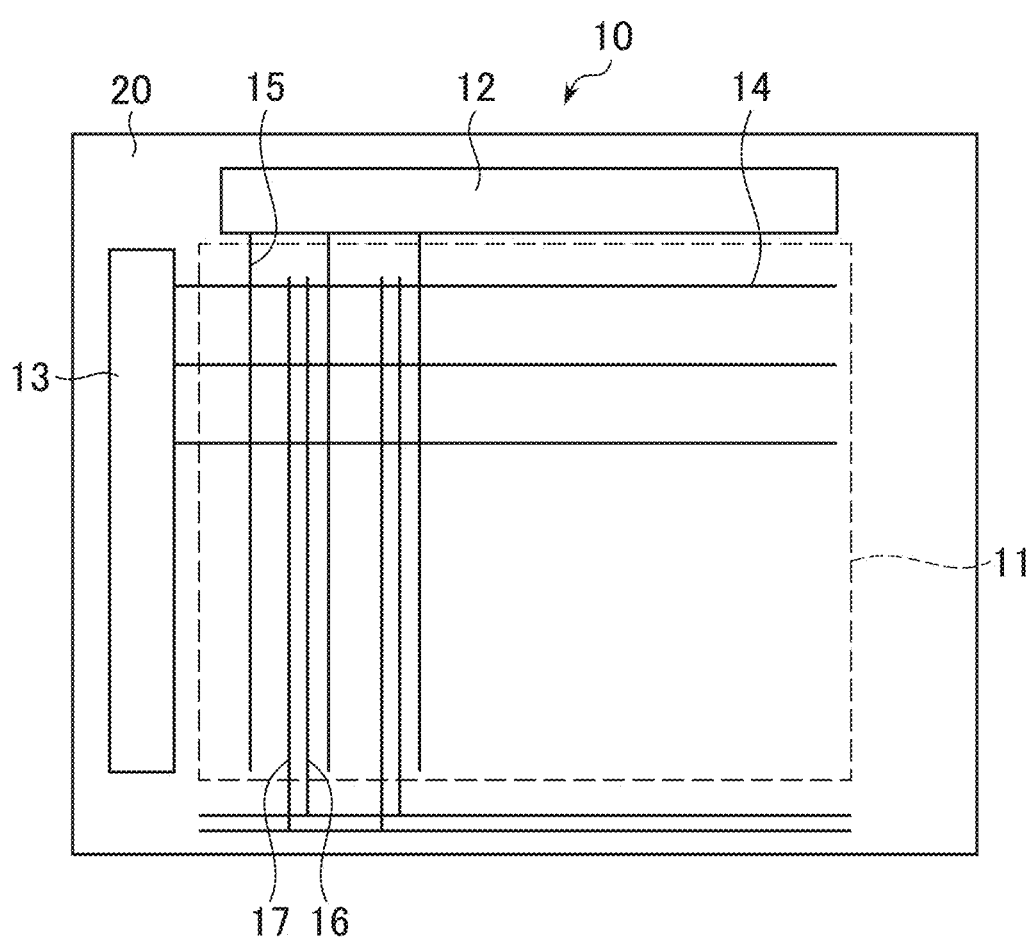
FIG. 2 is a wiring diagram of the organic EL display device of the embodiment of the invention.
Figure 3:
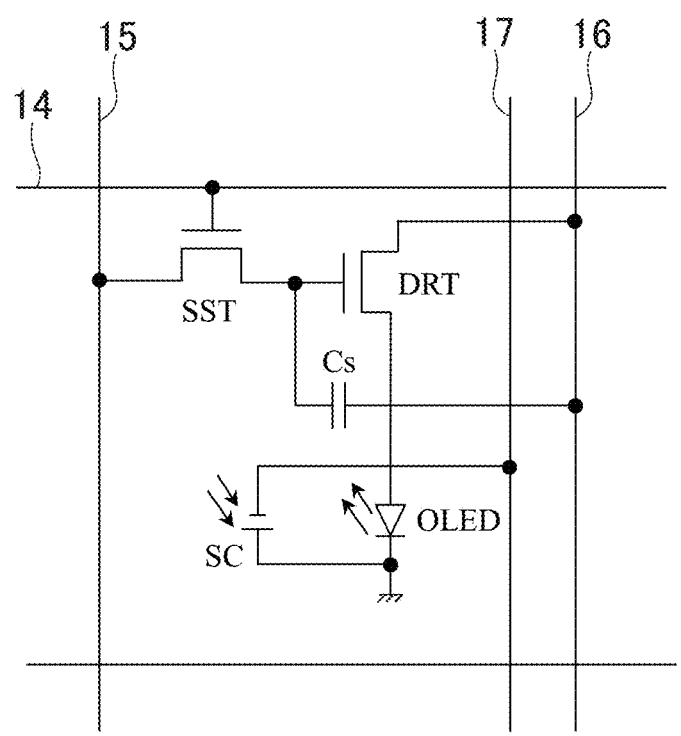
FIG. 3 is a circuit diagram of a pixel of the organic EL display device of the embodiment of the invention.

FIG. 2 is a wiring diagram of the organic EL panel 10 of the embodiment of the invention. FIG. 3 is a circuit diagram of a pixel of the organic EL panel 10 of the embodiment of the invention. The organic EL panel 10 controls respective pixels provided in a matrix form in a display area 11 by a video signal drive circuit 12 and a scanning signal drive circuit 13, and displays an image. Here, the video signal drive circuit 12 is a circuit to generate and transmit a video signal to be sent to the respective pixels. The scanning signal drive circuit 13 is a circuit to generate and transmit a scanning signal to a TFT (Thin Film Transistor) provided in the pixel. Incidentally, in the drawing, although the video signal drive circuit 12 and the scanning signal drive circuit 13 are formed in two places, they may be assembled in one IC (Integrated Circuit) or may be separately formed in three or more places. Besides, the circuit may be formed by using the TFT on the substrate simultaneously with the display area.

A scanning line 14 to transmit the signal from the scanning signal drive circuit 13 is electrically connected to a gate of a pixel transistor SST formed in each of pixel areas. The scanning line 14 is common to pixel transistors arranged in one row. The pixel transistor SST is a transistor whose source or drain is electrically connected to a gate of a drive transistor DRT. The drive transistor DRT is, for example, an n-channel field effect transistor, and a source thereof is electrically connected to an anode of an organic light-emitting diode OLED. A cathode of the organic light-emitting diode OLED is fixed to a ground potential or a negative potential. At this time, current flows through the organic light-emitting diode OLED from the anode to the cathode. A video signal line 15 to transmit the signal from the video signal drive circuit 12 is electrically connected to the source or the drain of the pixel transistor SST. The video signal line 15 is common to pixel transistors arranged in one column. When the scanning signal is applied to the scanning line 14, the pixel transistor SST is turned on. When the video signal is applied to the video signal line 15 in that state, the video signal voltage is applied to the gate of the drive transistor DRT, the voltage corresponding to the video signal is written in a storage capacitor Cs, and the drive transistor DRT is turned on. A power source line 16 is electrically connected to the drain of the drive transistor DRT. A power source voltage for causing the organic light-emitting diode OLED to emit light is applied to the power source line 16. When the drive transistor OLED is turned on, current corresponding to the magnitude of the video signal voltage flows through the organic light-emitting diode OLED, and the organic light-emitting diode OLED emits light.

A solar cell SC is provided on the organic EL panel 10 of the embodiment. The solar cell SC is a photoelectric conversion element, and converts incident light into a current. The solar cell SC is connected between the cathode of the organic light-emitting diode OLED and a charging line 17. The charging line 17 is a wiring through which the current generated by the photoelectric conversion element flows. The solar cell SC receives the light emitted from the neighboring organic light-emitting diode OLED and generates power. Besides, the solar cell SC receives external light incident from the visible side of the organic EL display device 1 and generates power. Incidentally, as shown in the following drawings, the solar cell SC may be disposed between the pixels. The charging line 17 may be connected to a battery or may be connected to the power source line 16 to assist light emission of the organic light-emitting diode OLED, or may be connected to the video signal drive circuit 12 and the scanning signal drive circuit 13 to assist power required for signal generation and transmission. The power consumption of the organic EL display device 1 can be reduced by using the power, which is generated by the solar cell SC, to drive the organic EL panel 10.

Figure 4:
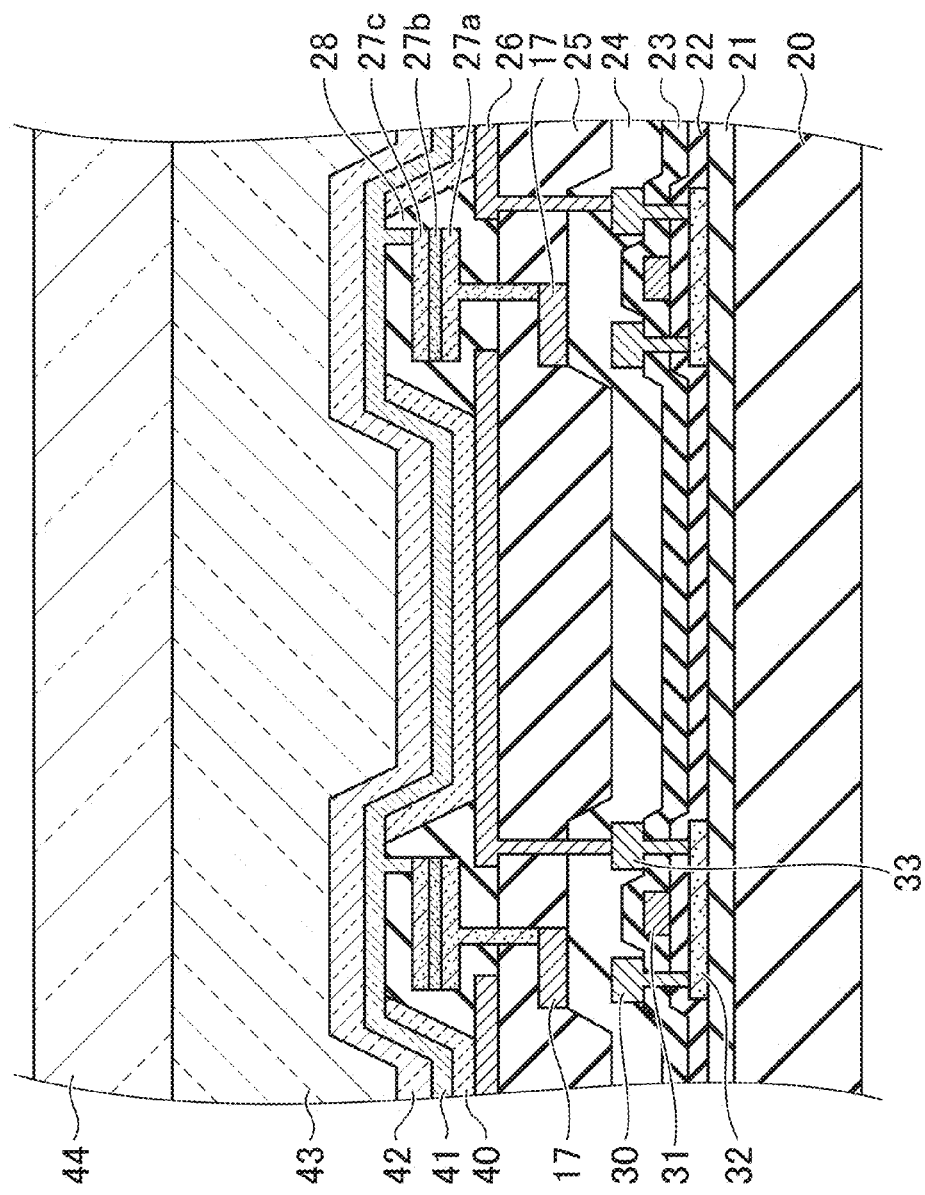
FIG. 4 is a sectional view of the pixel of the organic EL display device of the embodiment of the invention.

FIG. 4 is a sectional view of a pixel of the organic EL panel 10 of the embodiment of the invention. A substrate 20 is disposed in the lowermost layer of the organic EL panel 10. The substrate 20 is made of glass, resin or the like. A foundation film 21 of SiNx, SiOy or the like is formed on the substrate 20. A channel layer 32 for electrically connecting a drain electrode 30 and a source electrode 33 of the drive transistor is formed on the foundation film 21. The channel layer 32 is made of polycrystalline silicon. Incidentally, the channel layer 32 may be made of amorphous silicon, organic semiconductor, oxide semiconductor or the like. A first insulating film 22 of SiNx, SiOy or the like is formed on the foundation film 21 and the channel layer 32. A gate electrode 31 of the drive transistor made of a metal material is formed on the first insulating film 22. A second insulating film 23 of SiNx, SiOy or the like is formed on the first insulating film 22 and the gate electrode 31. A through hole reaching the channel layer 32 is provided in the second insulating film 23 and the first insulating film 22. The drain electrode 30 and the source electrode 33 of the drive transistor are made of metal material. An inter-layer insulating film 24 of SiNx, SiOy or the like is formed on the drain electrode 30, the source electrode 33 and the second insulating film 23. The charging line 17 of metal material is formed on the inter-layer insulating film 24. A flattening film 25 of SiNx, SiOy or the like is formed on the charging line 17 and the inter-layer insulating film 24. The flattening film 25 is made of an insulator, and the surface thereof is an insulating surface.

A pixel electrode 26 of metal material is formed on the insulating surface as the surface of the flattening film 25. The pixel electrode 26 becomes the anode of the organic light-emitting diode. The pixel electrode 26 is electrically connected to the source electrode 33 of the drive transistor through a through hole provided in the flattening film 25 and the inter-layer insulating film 24. The pixel electrode 26 is separately formed in each pixel. In the organic EL display device 1, a voltage is applied to a specific pixel electrode 26 to cause a corresponding pixel to emit light and an image is displayed.

A pixel separation film 28 of photosensitive resin such as acryl or polyimide or inorganic material such as SiNx or SiOy is formed on the flattening film 25 and the pixel electrode 26. The pixel separation film 28 is provided on an end of the pixel electrode 26 and is provided to cover the end of the pixel electrode 26. The pixel separation film 28 is provided between the end of the pixel electrode 26 and a counter electrode 41 described later, insulates between the pixel electrode 26 and the counter electrode 41, and prevents short circuit between the electrodes. Besides, The pixel separation film 28 defines a light-emitting area as described below.

An organic layer 40 is formed on the pixel electrode 26. The organic layer 40 is a layer including a light-emitting layer. The organic layer 40 is a layer in which a hole transport layer (or a hole injection layer and a hole transport layer), the light-emitting layer and an electron transport layer (or an electron transport layer and an electron injection layer) are sequentially stacked from the pixel electrode 26 side. The light-emitting area of the light-emitting layer is a portion of the light-emitting layer formed just above the pixel electrode 26 (portion of the light-emitting layer which is not formed on the pixel separation film 28). The light-emitting layer is provided to cover the pixel electrode 26. A hole flows into the light-emitting area of the light-emitting layer from the hole transport layer, and an electron flows thereinto from the electron transport layer. The electron and the hole are recombined in the light-emitting layer, the organic material forming the light-emitting layer is excited, and light is emitted when transition occurs from a higher energy level to a lower energy level. In the example shown in FIG. 4, the organic layer 40 is formed in an area surrounded by the pixel separation film 28, and is not formed on a top part of the pixel separation film 28. However, an area where the organic layer 40 is formed may be any portion other than this as long as the area is other than a connection part of a photoelectric conversion element described later.

The counter electrode 41 of a transparent conductive material such as ITO (Indium Tin Oxide) is formed on the organic layer 40 and the pixel separation film 28. The counter electrode 41 becomes the cathode of the organic light-emitting diode. A sealing film 42 is formed on the counter electrode 41. Further, a filler 43 is filled to prevent deterioration of the organic layer, and a counter substrate 44 is bonded to perform sealing. The filler 43 and the counter substrate 44 are not indispensable, and only the sealing film 42 may be used as long as the organic light-emitting diode part can be sufficiently protected. A black matrix, a color filter and a polarization plate may be formed on a front surface or a back surface of the counter substrate 44. Besides, a touch panel may be provided on the surface of the counter substrate 44. Incidentally, the black matrix may not be provided on the counter substrate 44 so that more external light is impinged on the solar cell SC.

The pixel separation film 28 includes a photoelectric conversion element. Here, the photoelectric conversion element may be a photodiode including a p-n junction of an inorganic semiconductor, an organic thin film solar cell, a quantum dot solar cell, or a dye-sensitized solar cell. In the embodiment, the pixel separation film 28 includes a p-type semiconductor layer 27$a$, an i-type semiconductor layer 27$b$ and an n-type semiconductor layer 27$c$. The insulating film forming the pixel separation film 28 is provided so as to surround the p-type semiconductor layer 27$a$, the i-type semiconductor layer 27$b$ and the n-type semiconductor layer 27$c$. The p-type semiconductor layer 27$a$, the i-type semiconductor layer 27$b$ and the n-type semiconductor layer 27$c$ are sequentially stacked and are overlappingly provided in plan view, and form the solar cell SC. Here, the i-type semiconductor layer 27$b$ is provided to be sandwiched between the p-type semiconductor layer 27$a$ and the n-type semiconductor layer 27$c$. The p-type semiconductor layer 27$a$ and the n-type semiconductor layer 27$c$ are indirectly joined to each other through the i-type semiconductor layer 27$b$ intervening therebetween. Incidentally, the solar cell SC may not necessarily include the i-type semiconductor layer 27$b$, and the p-type semiconductor layer 27$a$ and the n-type semiconductor layer 27$c$ may be directly joined. Besides, the solar cell SC may include plural p-n junctions.

One of a first electrode and a second electrode of the photoelectric conversion element is electrically connected to the counter electrode 41, and the other is electrically connected to the charging line 17. In the embodiment, a through hole is provided in the bottom part of the pixel separation film 28 and the flattening film 25, and the p-type semiconductor layer 27$a$ and the charging line 17 are electrically connected through the first electrode. Besides, a through hole is provided in the top part of the pixel separation film 28, and the n-type semiconductor layer 27$c$ and the counter electrode 41 are electrically connected through the second electrode. The organic layer 40 has only to be formed to avoid the through hole provided in the top part of the pixel separation film 28. Incidentally, a portion of the p-type semiconductor layer 27$a$ where the connection electrode to the charging line 17 is provided may be a p$^+$-layer having a high impurity concentration. Besides, a portion of the n-type semiconductor layer 27$c$ where the connection electrode to the counter electrode 41 is provided may be an n$^-$-layer having a high impurity concentration. By adopting such structure, an electron is prevented from flowing into the charging line 17, and a hole is prevented from flowing into the counter electrode 41.

When light generated in the light-emitting layer or external light is incident on one of the p-type semiconductor layer 27$a$, the i-type semiconductor layer 27$b$ and the n-type semiconductor layer 27$c$ and if the energy of the light is higher than the band gap energy, a pair of an electron and a hole are generated. Here, if the potential of the charging line 17 is lower than the potential of the counter electrode 41, the generated hole flows into the charging line 17 through the p-type semiconductor layer 27$a$, and the generated electron flows into the counter electrode 41 through the n-type semiconductor layer 27$c$. Apart of the light generated in the semiconductor layer and emitted in an adjacent pixel direction is absorbed by the solar cell SC and is changed into a pair of an electron and a hole. Thus, light leakage to the adjacent pixel is prevented. Besides, power consumption is reduced by using the generated charges to drive the organic EL display device 1. Incidentally, the pair of electron and hole is generated in the p-type semiconductor layer 27$a$, in order for the electron to reach the counter electrode 41, the thickness of the p-type semiconductor layer 27$a$ is desirably roughly the minority carrier (electron) diffusion length of the p-type semiconductor layer 27$a$ or less than that. Similarly, the thickness of the n-type semiconductor layer 27$c$ is desirably roughly the minority carrier (hole) diffusion length of the n-type semiconductor layer 27$c$ or less than that.

In the embodiment, the potential of the charging line 17 is lower than the potential of the counter electrode 41. The leakage current to the adjacent pixel is suppressed by the structure as stated above. The leakage current to the adjacent pixel can occur when charges pass through the pixel separation film 28 and leak to the adjacent pixel. For example, holes can penetrate into the pixel separation film 28 from the hole transport layer formed on the pixel electrode 26. Even in that case, if the potential of the charging line 17 is lower than the potential of the counter electrode 41, the holes penetrating into the pixel separation film 28 are attracted to the charging line 17 and become hard to reach the adjacent pixel. Thus, when the potential of the charging line 17 is made lower than the potential of the counter electrode 41, the leakage current to the adjacent pixel is suppressed. When the potential of the charging line 17 is made lower than the potential of the counter electrode 41, the p-type semiconductor layer 27$a$ is connected to the charging line 17, and the n-type semiconductor layer 27$c$ is connected to the counter electrode 41. However, the potential of the charging line 17 may be made higher than the potential of the counter electrode 41. In that case, the n-type semiconductor layer 27$c$ is connected to the charging line 17, and the p-type semiconductor layer 27$a$ is connected to the counter electrode 41.

The organic light-emitting diode formed of the organic layer 40 may be of a so-called tandem type. That is, a first organic light-emitting diode may be formed by sequentially stacking a hole transport layer, a first light-emitting layer and an electron transport layer, and a charge generation layer is formed on the electron transport layer. A second organic light-emitting diode may be formed on the charge generation layer by sequentially stacking a hole transport layer, a second light-emitting layer and an electron transport layer. Further, a charge generation layer is stacked, and a third organic light-emitting diode may be formed by sequentially stacking a hole transport layer, a third light-emitting layer and an electron transport layer. The whole tandem-type organic light-emitting diode is enabled to have a white luminescent color by adjusting the luminescent colors of the plural stacked organic light-emitting diodes. In that case, full-color image display is performed by providing color filters on the counter substrate 44 and the like.

Figure 5:
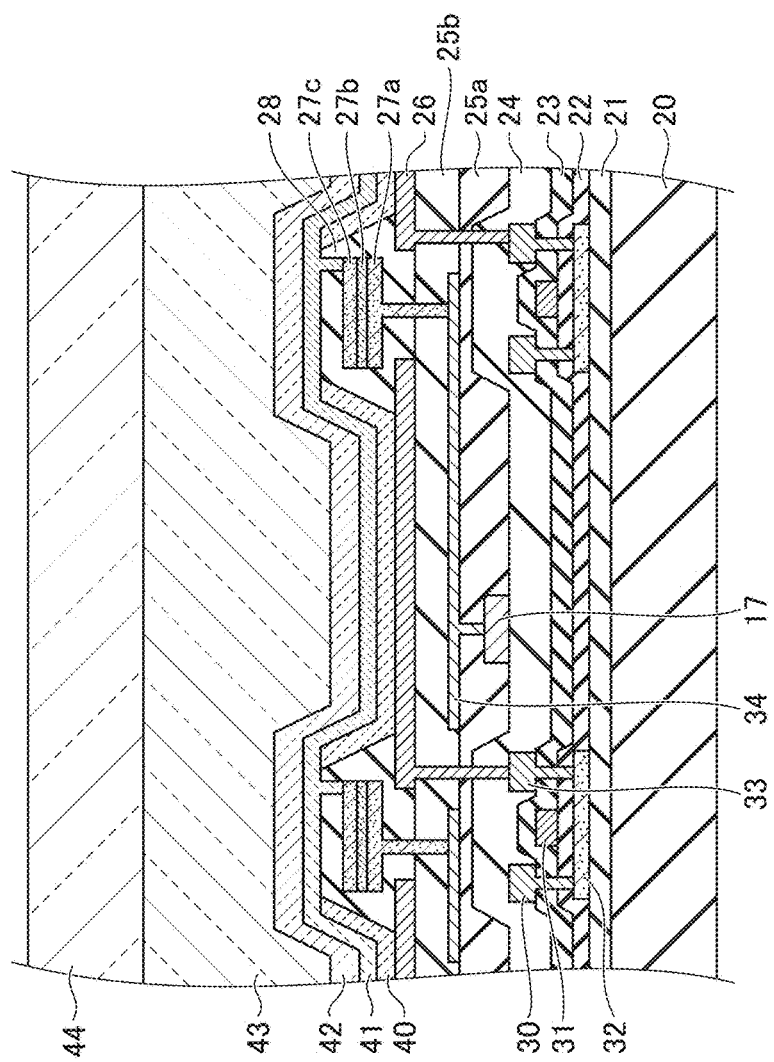
FIG. 5 is a sectional view of a pixel of an organic EL display device of a first modified example.

FIG. 5 is a sectional view of a pixel of an organic EL panel 10 of a first modified example. A difference between the first modified example and the embodiment shown in FIG. 4 is that a charging line 17 is provided on an inter-layer insulating film 24, a flattening film 25 includes a first flattening film 25$a$ and a second flattening film 25$b$, and a capacitance electrode 34 is provided on the first flattening film 25$a$.

In the first modified example, a p-type semiconductor layer 27$a$ is electrically connected to the capacitance electrode 34 through a through hole provided in a pixel separation film 28 and the second flattening film 25b. The capacitance electrode 34 is electrically connected to the charging line 17 through a through hole provided in the first flattening film 25a. The capacitance electrode 34 is provided to face a pixel electrode 26. The pixel electrode 26 is provided to extend between the pixel separation films 28, and the capacitance electrode 34 is provided to overlap the pixel electrode 26 in plan view. The pixel electrode 26 and the capacitance electrode 34 face each other through the second flattening film 25b as an insulator, and function as a capacitance to hold a charge. In the case of this example, a charge generated by a solar cell SC is stored in the capacitance formed of the pixel electrode 26 and the capacitance electrode 34. The sharpness of an image can be improved by storing the charge generated by the solar cell SC in the capacitance formed of the pixel electrode 26 and the capacitance electrode 34 as in this example.

Figure 6:
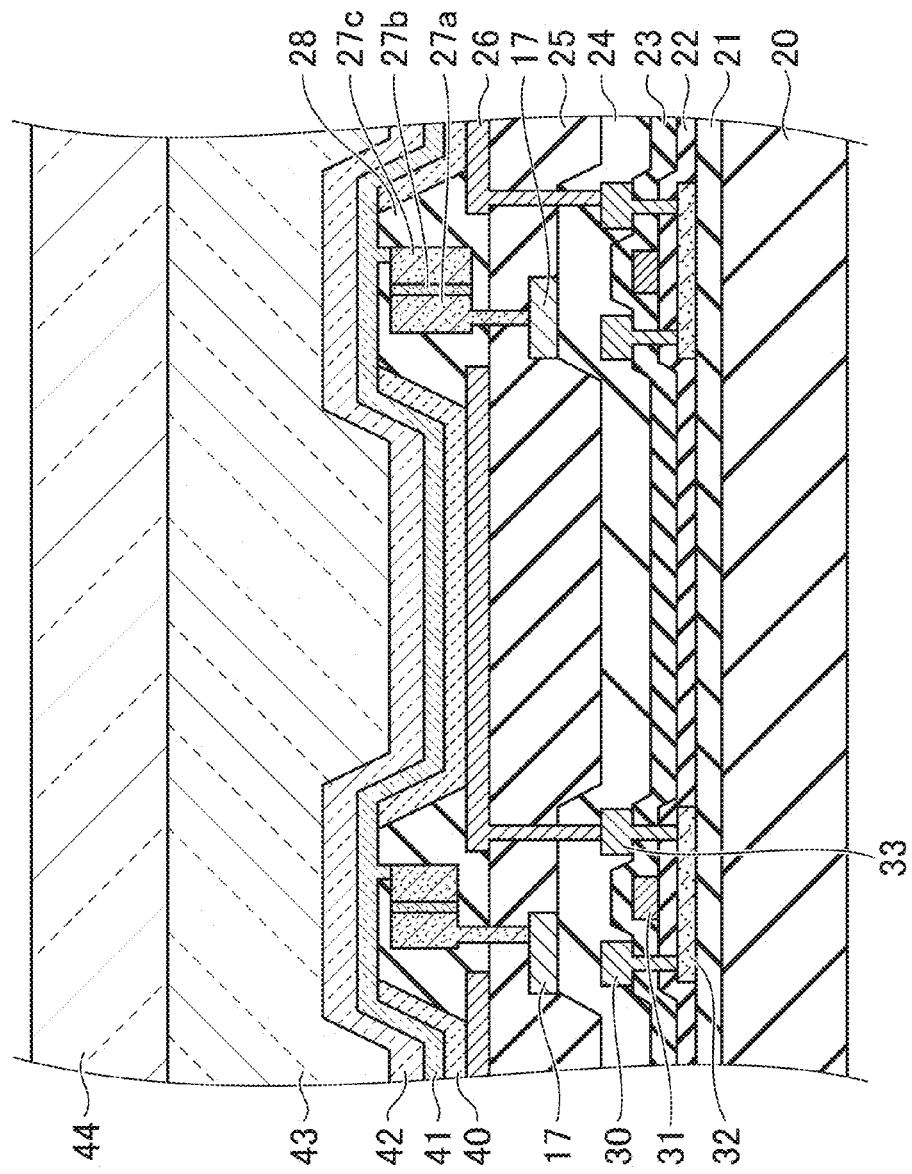
FIG. 6 is a sectional view of a pixel of an organic EL display device of a second modified example.

FIG. 6 is a sectional view of a pixel of an organic EL panel 10 of a second modified example. A difference between the second modified example and the embodiment shown in FIG. 4 is that a p-type semiconductor layer 27a, an i-type semiconductor layer 27b and an n-type semiconductor layer 27c are provide to be adjacent to each other in plan view. That is, in the second modified example, the p-type semiconductor layer 27a, the i-type semiconductor layer 27b and the n-type semiconductor layer 27c are not provided to overlap each other when viewed from a plane facing a substrate 20, and respective interfaces therebetween are in a plane crossing the substrate 20.

Also in the second modified example, the p-type semiconductor layer 27a is electrically connected to a charging line 17. The n-type semiconductor layer 27c is electrically connected to a counter electrode 41. Also in such structure, when light generated in a light-emitting layer or external light is incident on one of the p-type semiconductor layer 27a, the i-type semiconductor layer 27b and the n-type semiconductor layer 27c, a charge is generated and power is generated. Thus, light leakage to an adjacent pixel is prevented. Besides, power consumption is reduced by using the generated charges to drive the organic EL display device 1.

Figure 7:
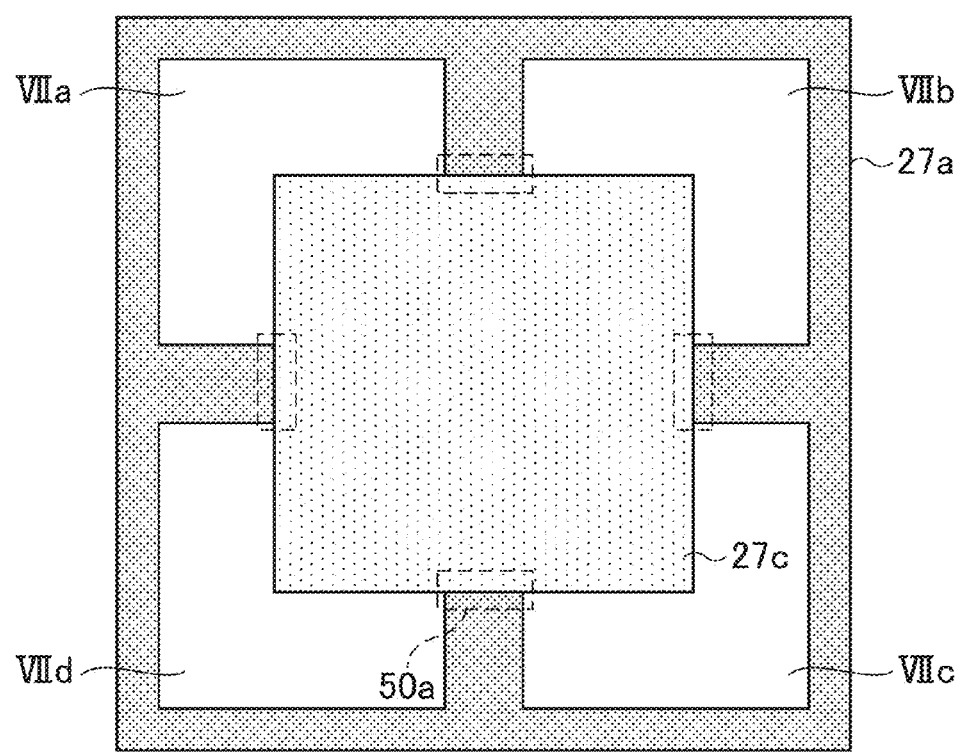
FIG. 7 is a plan view of a pixel of an organic EL display device of a third modified example.

FIG. 7 is a plan view of a pixel of an organic EL panel 10 of a third modified example. In the third modified example, a p-type semiconductor layer 27a and an n-type semiconductor layer 27c are provided to be adjacent to each other in plan view similarly to the second modified example. Here, an i-type semiconductor layer 27b may be provided between the p-type semiconductor layer 27a and the n-type semiconductor layer 27c. With respect to pixels in the third modified example, a unit pixel is formed of four sub-pixels shown in FIG. 7, for example, a sub-pixel VIIa to emit red light, a sub-pixel VIIb to emit green light, a sub-pixel VIIc to emit blue light, and a sub-pixel VIId to emit white light. The p-type semiconductor layer 27a or the n-type semiconductor layer 27c is buried in a pixel separation film 28 to separate pixels. FIG. 7 shows the p-type semiconductor layer 27a or the n-type semiconductor layer 27c buried in the pixel separation film 28. The p-type semiconductor layer 27a is electrically connected to a charging line 17. Besides, the n-type semiconductor layer 27c is electrically connected to a counter electrode 41. The p-type semiconductor layer 27a and the n-type semiconductor layer 27c are directly joined to each other in a p-n junction part 50a. The p-n junction part 50a is provided at four places per one unit pixel. When light generated in a light-emitting layer or external light is incident on a portion near the p-n junction part 50a, a pair of an electron and a hole are generated, and power is generated. Besides, power is generated also when light is incident on one of the p-type semiconductor layer 27a and the n-type semiconductor layer 27c. Thus, light leakage to an adjacent pixel is prevented. Besides, power consumption is reduced by using the generated charges to drive the organic EL display device 1.

Figure 8:
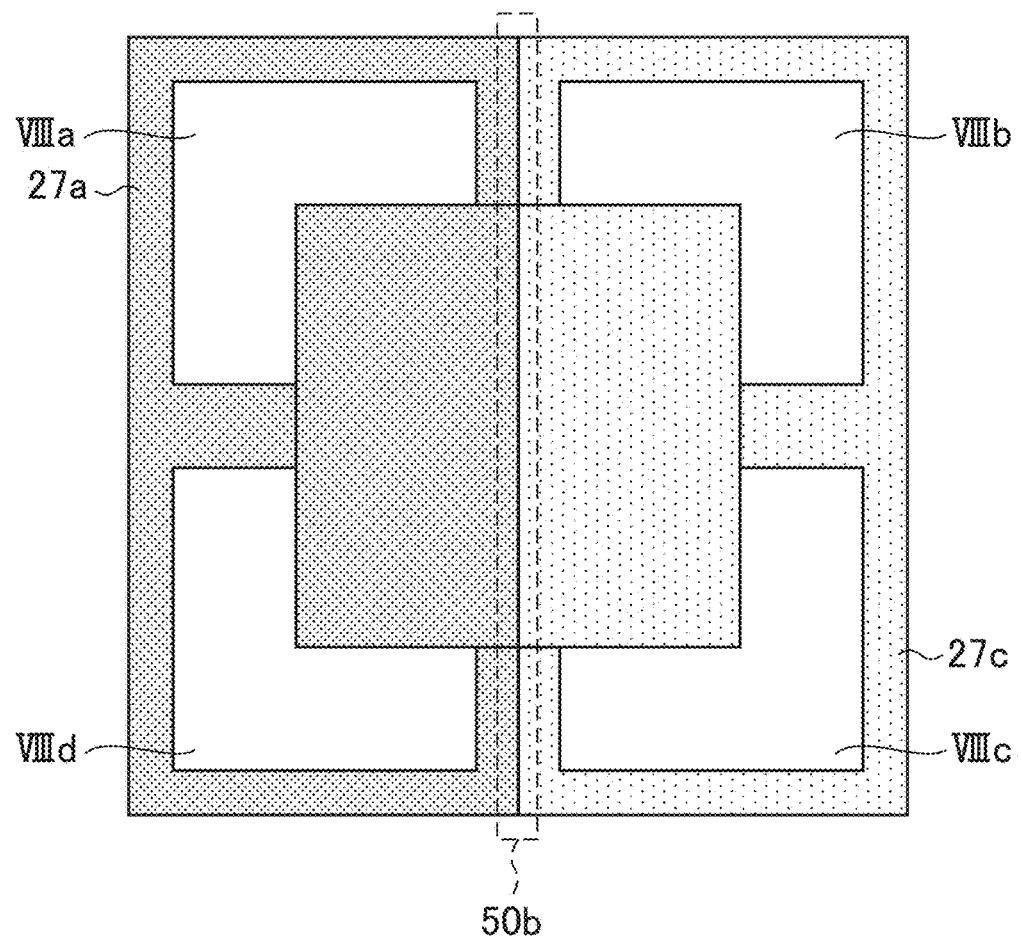
FIG. 8 is a plan view of a pixel of an organic EL display device of a fourth modified example.

FIG. 8 is a plan view of a pixel of an organic EL panel 10 of a fourth modified example. In the fourth modified example, a p-type semiconductor layer 27a and an n-type semiconductor layer 27c are provided to be adjacent to each other in plan view similarly to the second modified example. Here, an i-type semiconductor layer 27b may be provided between the p-type semiconductor layer 27a and the n-type semiconductor layer 27c. With respect to pixels in the fourth modified example, a unit pixel is formed of, for example, a sub-pixel VIIIa to emit red light, a sub-pixel VIIIb to emit green light, a sub-pixel VIIIc to emit blue light, and a sub-pixel VIIId to emit white light. The p-type semiconductor layer 27a or the n-type semiconductor layer 27c is buried in a pixel separation film 28 to separate pixels. FIG. 8 shows the p-type semiconductor layer 27a or the n-type semiconductor layer 27c buried in the pixel separation film 28. The p-type semiconductor layer 27a is electrically connected to a charging line 17. Besides, the n-type semiconductor layer 27c is electrically connected to a counter electrode 41. The p-type semiconductor layer 27a and the n-type semiconductor layer 27c are directly joined to each other in a p-n junction part 50b. The p-n junction part 50b is provided at one place per one unit pixel. The p-n junction part 50b is provided to extend over pixels arranged in a column direction. However, the p-n junction part 50b may be provided to extend over pixels arranged in a row direction. The area of the p-n junction part 50b can be more increased by adopting the structure as stated above, and higher power can be generated.

Figure 9:
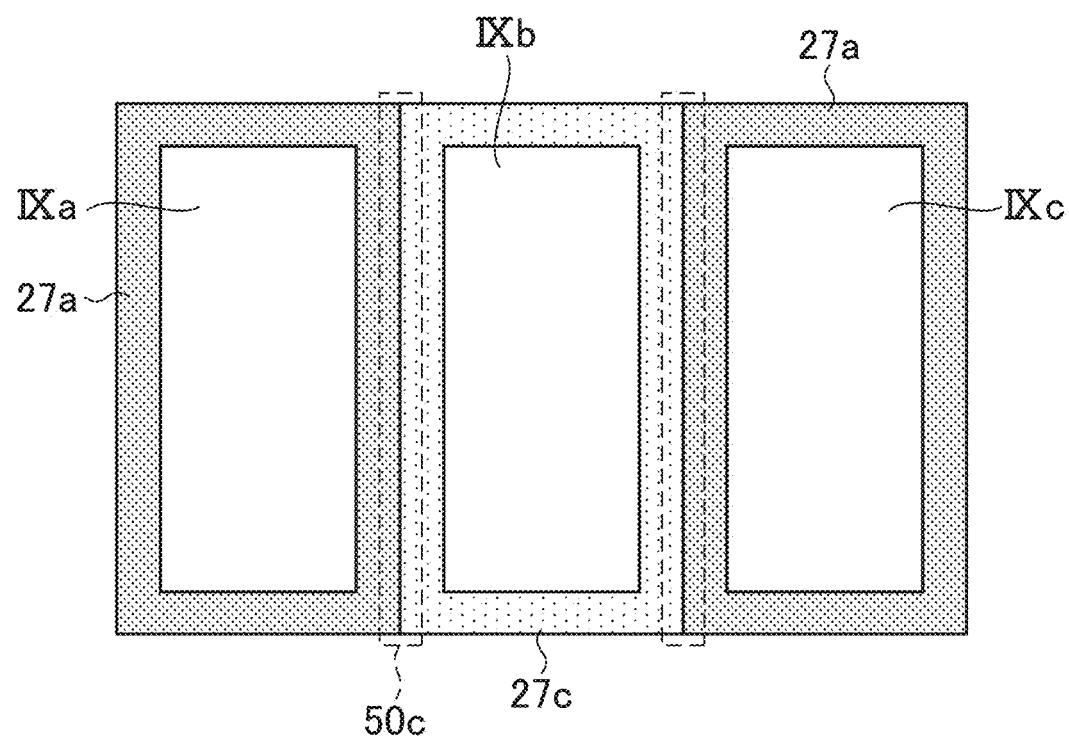
FIG. 9 is a plan view of a pixel of an organic EL display device of a fifth modified example.

FIG. 9 is a plan view of a pixel of an organic EL panel 10 of a fifth modified example. In the fifth modified example, a p-type semiconductor layer 27a and an n-type semiconductor layer 27c are provided to be adjacent to each other in plan view similarly to the second modified example. Here, an i-type semiconductor layer 27b may be provided between the p-type semiconductor layer 27a and the n-type semiconductor layer 27c. With respect to pixels in the fifth modified example, a unit pixel is formed of three sub-pixels shown in FIG. 9, for example, a sub-pixel IXa to emit red light, a sub-pixel IXb to emit green light and a sub-pixel IXc to emit blue light. The p-type semiconductor layer 27a or the n-type semiconductor layer 27c is buried in a pixel separation film 28 to separate pixels. FIG. 9 shows the p-type semiconductor layer 27a or the n-type semiconductor layer 27c buried in the pixel separation film 28. The p-type semiconductor layer 27a is electrically connected to a charging line 17. Besides, the n-type semiconductor layer 27c is electrically connected to a counter electrode 41. The p-type semiconductor layer 27a and the n-type semiconductor layer 27c are directly joined to each other in a p-n junction part 50c. The p-n junction part 50c is provided at two places per one unit pixel. The p-n junction part 50c is provided to extend over pixels arranged in a column direction. The area of the p-n junction part 50c can be more increased by adopting the structure as stated above, and higher power can be generated.

Figure 10:
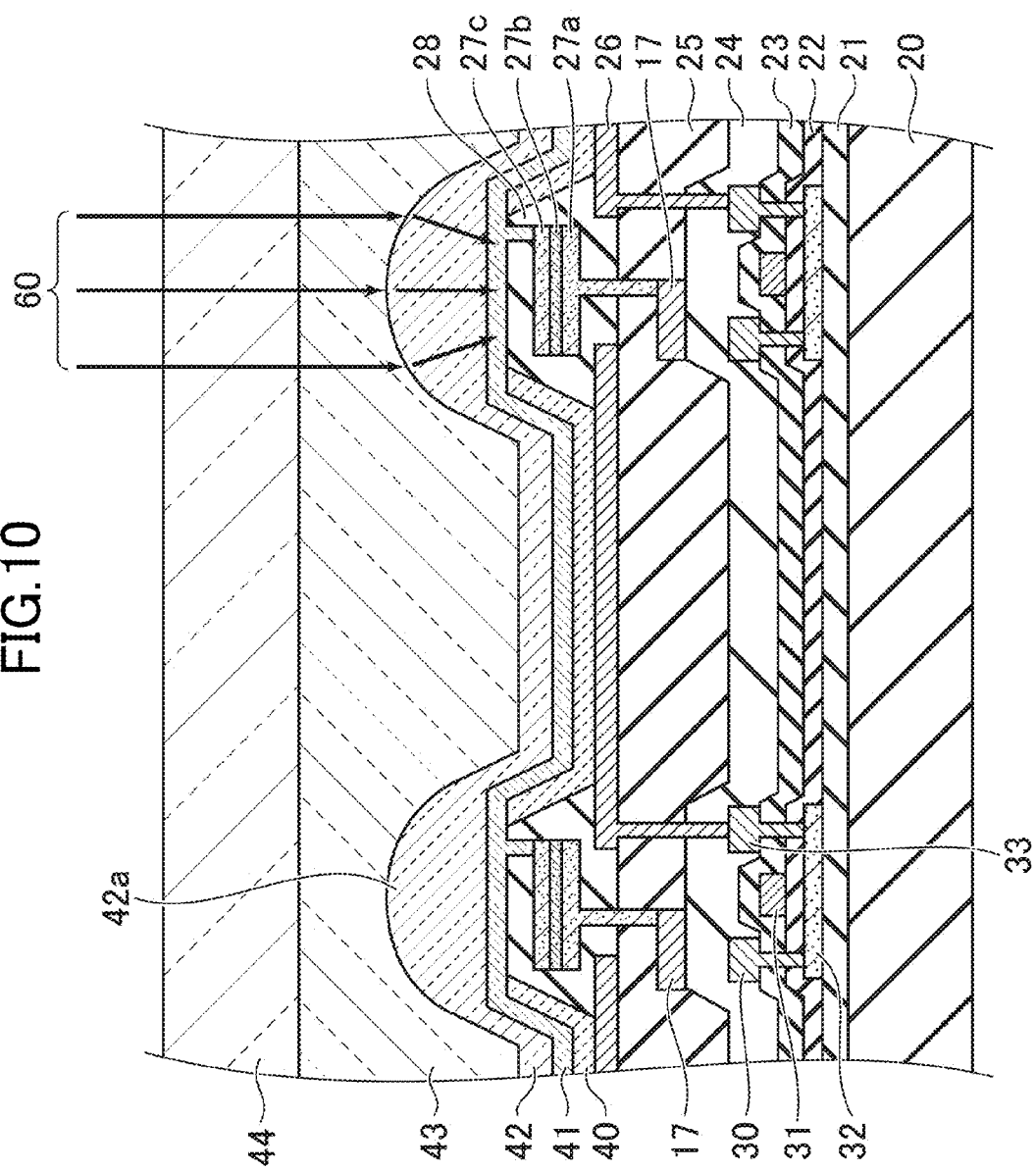
FIG. 10 is a sectional view of a pixel of an organic EL display device of a sixth modified example.

FIG. 10 is a sectional view of a pixel of an organic EL panel 10 of a sixth modified example. A difference between the sixth modified example and the embodiment shown in FIG. 4 is that a convex lens 42a as a condensing lens is formed above a pixel separation film 28 by a sealing film 42. The convex lens 42a concentrates external light 60 onto a solar cell SC. Thus, in the organic EL panel 10 of the sixth modified example, power generation using the external light can be more efficiently performed, and power consumption of the organic EL display device 1 can be more reduced. Here, the focal point of the convex lens 42*a* is preferably adjusted to be positioned at a p-n junction part of the solar cell SC. Incidentally, the convex lens 42*a* may be formed separately from the sealing film 42. When the condensing lens is formed by the sealing film 42 as a protecting film to protect a light-emitting layer, the protecting film of the light-emitting layer and the condensing lens can be simultaneously formed, and the organic EL panel 10 including the condensing lens can be manufactured in less steps.

Figure 11:
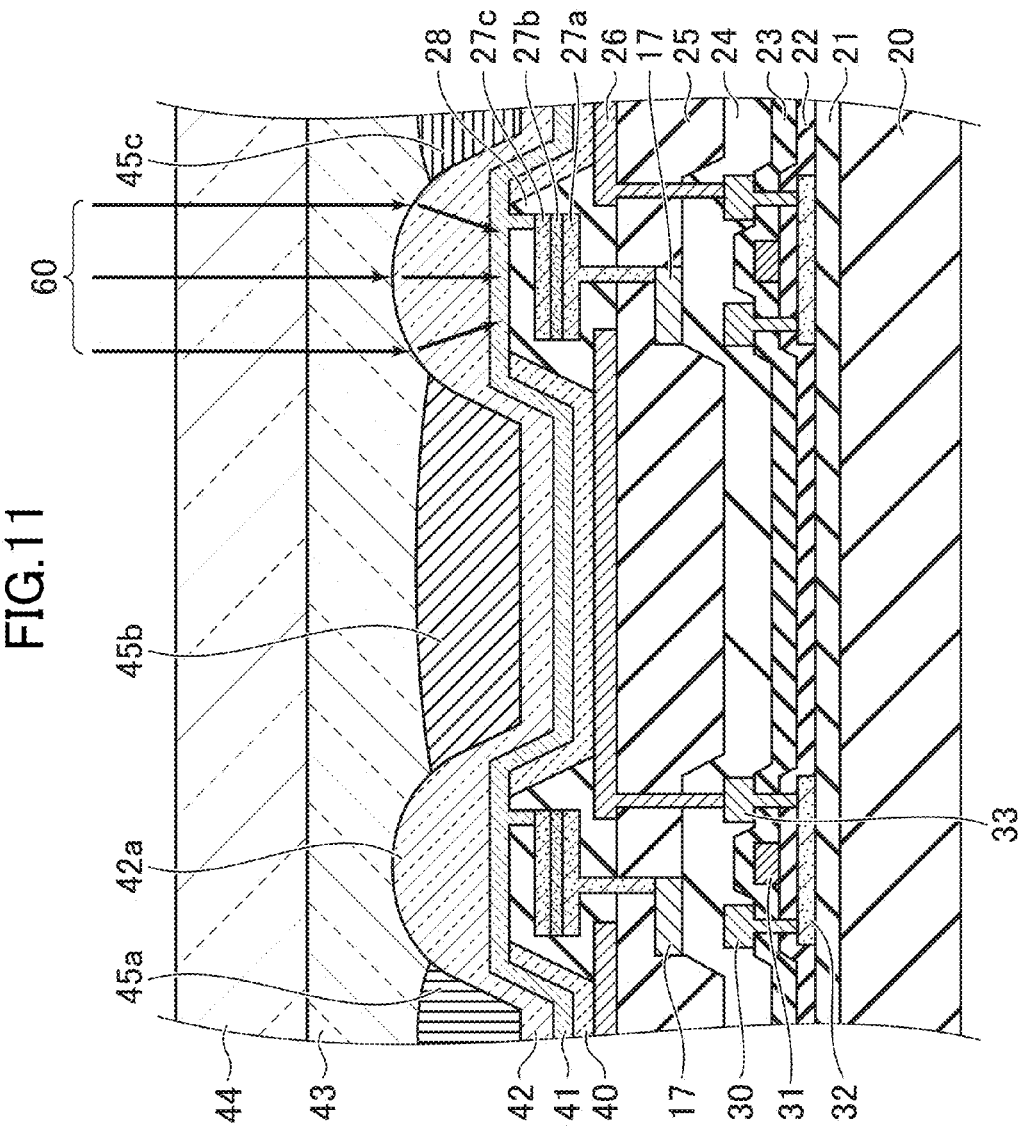
FIG. 11 is a sectional view of a pixel of an organic EL display device of a seventh modified example.

FIG. 11 is a sectional view of a pixel of an organic EL panel 10 of a seventh modified example. In the seventh modified example, in addition to the structure of the sixth modified example, a red color filter 45*a*, a green color filter 45*b* and a blue color filter 45*c* are provided on a sealing film 42 and above a pixel electrode 26. In the seventh modified example, a convex lens 42*a* has not only a function to concentrate external light 60 onto a solar cell SC but also a function as a separation film of the color filter 45. The color filter 45 is not provided on a counter substrate 44 but is provided on the sealing film 42, so that the thinner organic EL panel 10 can be obtained. Besides, when the color filter 45 is provided on the sealing film 42, the distance between the color filter 45 and an organic layer 40 including a light-emitting layer becomes short as compared with the case where the color filter 45 is provided on the counter substrate 44. Thus, leakage light to an adjacent pixel is reduced, and color mixture is suppressed.

Figure 12:
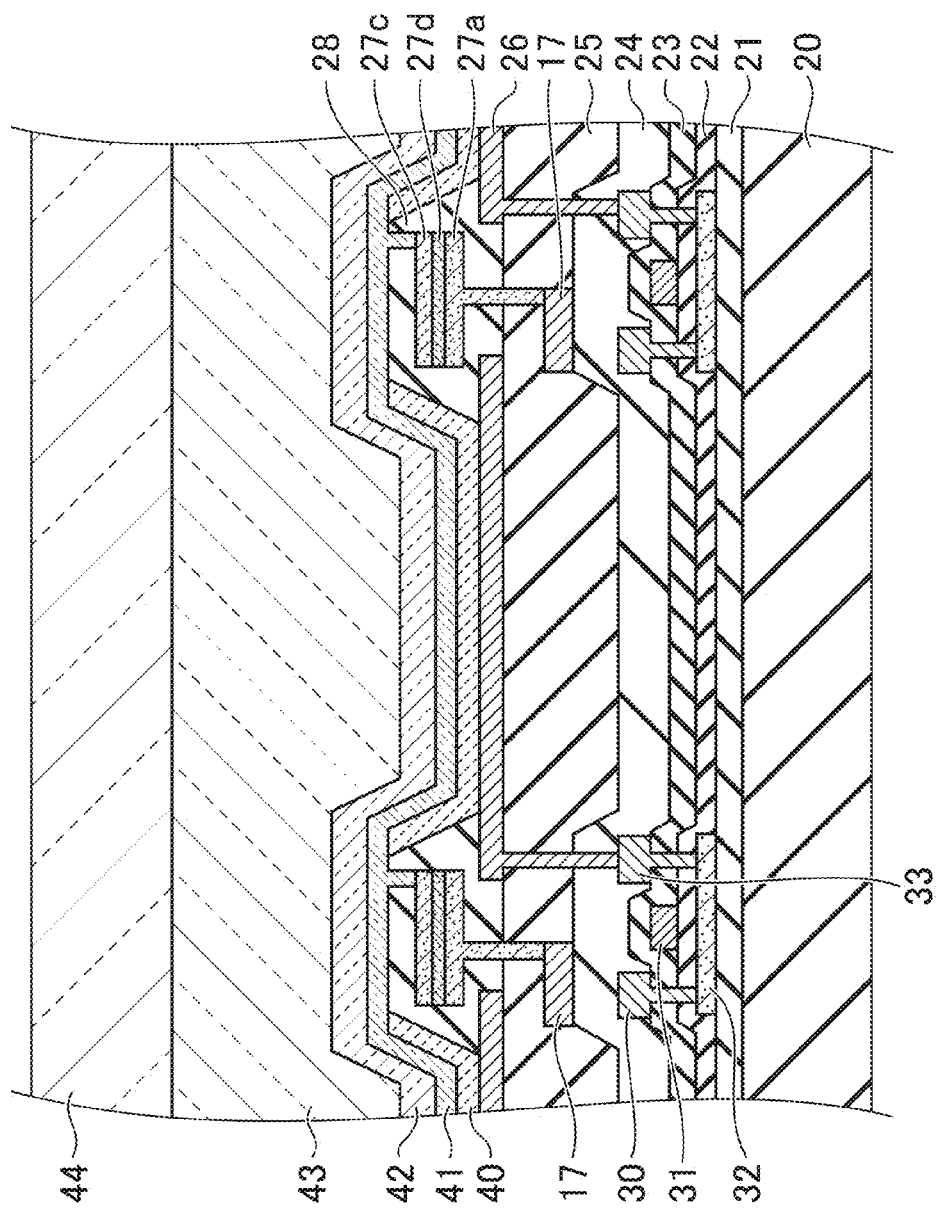
FIG. 12 is a sectional view of a pixel of an organic EL display device of an eighth modified example.

FIG. 12 is a sectional view of a pixel of an organic EL panel 10 of an eighth modified example. A difference between the eighth modified example and the embodiment shown in FIG. 4 is that a pixel separation film 28 includes a quantum dot element 27*d*. A photoelectric conversion element of the modified example is a quantum dot solar cell in which a p-type semiconductor layer 27*a*, the quantum dot element 27*d* and an n-type semiconductor layer 27*c* are sequentially stacked. The quantum dot sola cell can form band gaps with various sizes by adjusting the size of the quantum dot. Besides, the band gap can be changed stepwise by gradually changing the size of the quantum dot in a direction vertical to a substrate 20, and power generation can be performed by absorbing different wavelength lights. Further, a band gap which is not generated in a one-dimensional or two-dimensional arrangement can be formed by three-dimensionally arranging the quantum dots. In the quantum dot solar cell, there is a case where multiple exciton generation is confirmed in which two pairs of electrons and holes are generated by one photon (when light has a frequency ν, the photon is a light quantum with an energy of hν. Here, h denotes Planck's constant). Thus, the quantum dot solar cell has a merit that the band gap can be designed and further has a merit that power generation efficiency is improved as compared with a related art solar cell.

Any organic EL display device, which is obtained by design change by a person skilled in the art based on the organic EL display device 1 described above as the embodiment of the invention and can be carried out, falls within the scope of the invention as long as the gist of the invention is included. Besides, a display device other than the organic EL display device, for example, a quantum dot display device or the like also falls within the scope of the invention.

A person skilled in the art can conceive various modifications and corrections within the concept of the invention, and it is understood that the modifications and corrections fall within the scope of the invention. For example, those obtained by a person skilled in the art by addition of components, deletion or design change with respect to the foregoing respective embodiments, or by addition of steps, omission or condition change fall within the scope of the invention as long as the gist of the invention is included.

Besides, other operations and effects provided by the mode described in the embodiment, which are obvious from the specification or can be easily conceived by a person skilled in the art, are naturally interpreted as being obtained from the invention.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a first insulating layer;
   a wiring under the first insulating layer;
   a pixel electrode on the first insulating layer;
   a second insulating layer on an end of the pixel electrode;
   a light-emitting layer covering an upper surface of the pixel electrode except for an end part that is covered by the second insulating layer;
   a counter electrode covering the light-emitting layer and the second insulating layer; and
   a photoelectric conversion element inside the second insulating layer, the photoelectric conversion element including a p-type semiconductor layer and an n-type semiconductor layer arranged side by side in a direction along the upper surface of the pixel electrode, a first one of the p-type semiconductor layer and the n-type semiconductor layer being connected to the counter electrode, a second one of the p-type semiconductor layer and the n-type semiconductor layer having a lower surface that includes a first lower surface area that is connected to the wiring and a second lower surface area that is in contact with the second insulating layer, wherein,
   the p-type semiconductor layer and the n-type semiconductor layer have mutually opposed surfaces in planes perpendicular to the upper surface of the pixel electrode.

2. The display device according to claim 1, wherein the second insulating layer is located between the end of the pixel electrode and the counter electrode, and insulates between the pixel electrode and the counter electrode.

3. The display device according to claim 1, wherein
   the photoelectric conversion element further includes an i-type semiconductor layer, and
   the i-type semiconductor layer is configured to be sandwiched between the p-type semiconductor layer and the n-type semiconductor layer.

4. The display device according to claim 1, further comprising a plane electrode under the pixel electrode and the first insulating layer with the first insulating layer interposed between the plane electrode and the pixel electrode, the plane electrode being connected to one of the p-type semiconductor layer and the n-type semiconductor layer.

5. The display device according to claim 1, further comprising a condensing lens above the second insulating layer.

6. The display device according to claim 5, wherein the condensing lens is a part of a protecting film over the light-emitting layer to prevent deterioration of the light-emitting layer.

7. The display device according to claim 6, further comprising a color filter on the protecting film and above the pixel electrode.

8. The display device according to claim 1, wherein the p-type semiconductor layer is electrically connected to the wiring, and
the n-type semiconductor layer is electrically connected to the counter electrode.

9. The display device according to claim 1, further comprising:
a transistor which has a channel layer, a drain electrode, and a source electrode, the transistor being connected to the pixel electrode; and
an inter-layer insulating film on which the wiring is provided, the inter-layer insulating film covering the transistor.

10. The display device according to claim 9, wherein the wiring is directly connected to neither the pixel electrode nor the transistor.

11. The display device according to claim 1, further comprising a substrate on which the photoelectric conversion element, the second insulation layer, and the light-emitting layer are provided,
wherein a first distance between a top surface of the photoelectric conversion element and the substrate is smaller than a second distance between a top surface of the second insulation layer and the substrate, and a third distance between a bottom surface of the light-emitting layer and the substrate is smaller than the first distance.

12. The display device according to claim 1, wherein the photoelectric conversion element and the pixel electrode overlap with each other.

* * * * *